(12) United States Patent
Zhou

(10) Patent No.: US 10,431,498 B2
(45) Date of Patent: Oct. 1, 2019

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/971,002

(22) Filed: May 4, 2018

(65) Prior Publication Data

US 2018/0323107 A1    Nov. 8, 2018

(30) Foreign Application Priority Data

May 5, 2017    (CN) .......................... 2017 1 0312533

(51) Int. Cl.
*H01L 21/00* (2006.01)
*H01L 27/00* (2006.01)
(Continued)

(52) U.S. Cl.
CPC .... *H01L 21/823431* (2013.01); *H01L 21/266* (2013.01); *H01L 21/823418* (2013.01); *H01L 21/823437* (2013.01); *H01L 21/823468* (2013.01); *H01L 27/0886* (2013.01); *H01L 29/0847* (2013.01); *H01L 29/41791* (2013.01);
(Continued)

(58) Field of Classification Search
CPC ....... H01L 21/823842; H01L 21/28061; H01L 21/265; H01L 21/266; H01L 21/823431; H01L 21/26506; H01L 21/823418; H01L 21/823468; H01L 21/0886; H01L 21/823814; H01L 21/823828; H01L 21/823864; H01L 27/092; H01L 27/088; H01L 27/1108; H01L 27/0886; H01L 29/6659; H01L 29/6653; H01L 29/6656;
(Continued)

(56) References Cited

U.S. PATENT DOCUMENTS

| | | | | |
|---|---|---|---|---|
| 6,815,300 B2* | 11/2004 | Jeong | ............... | H01L 21/31111 |
| | | | | 257/E21.251 |
| 6,982,212 B2* | 1/2006 | Stolk | ............... | H01L 21/26513 |
| | | | | 438/482 |

(Continued)

FOREIGN PATENT DOCUMENTS

KR    20040037847    * 10/2004    ........... H01L 21/336

*Primary Examiner* — Nikolay K Yushin
(74) *Attorney, Agent, or Firm* — Anova Law Group, PLLC

(57) ABSTRACT

A method for fabricating a semiconductor structure includes forming a plurality of gate structures on the base substrate with each gate structure including a gate electrode and sidewall spacers on each aide surface of the gate electrode, forming source/drain doped regions in the base substrate on opposite sides of each gate structure, forming a sacrificial layer on side surfaces of each sidewall spacer, and performing a pre-amorphous ion implantation process on the source/drain doped regions using the sacrificial layer as a mask.

20 Claims, 7 Drawing Sheets

(51) Int. Cl.
*H01L 29/00* (2006.01)
*H01L 21/8234* (2006.01)
*H01L 21/266* (2006.01)
*H01L 27/088* (2006.01)
*H01L 29/08* (2006.01)
*H01L 29/417* (2006.01)
*H01L 29/66* (2006.01)
*H01L 29/78* (2006.01)
*H01L 29/45* (2006.01)
*H01L 21/265* (2006.01)
*H01L 21/8238* (2006.01)
*H01L 27/092* (2006.01)
*H01L 29/165* (2006.01)

(52) U.S. Cl.
CPC ...... *H01L 29/6653* (2013.01); *H01L 29/6656* (2013.01); *H01L 29/66545* (2013.01); *H01L 29/7848* (2013.01); *H01L 21/26506* (2013.01); *H01L 21/823814* (2013.01); *H01L 21/823821* (2013.01); *H01L 21/823828* (2013.01); *H01L 21/823864* (2013.01); *H01L 27/0924* (2013.01); *H01L 29/165* (2013.01); *H01L 29/45* (2013.01); *H01L 29/665* (2013.01)

(58) Field of Classification Search
CPC ............. H01L 29/0847; H01L 29/4791; H01L 29/66545; H01L 29/45; H01L 29/665
See application file for complete search history.

(56) References Cited

U.S. PATENT DOCUMENTS

| | | | | |
|---|---|---|---|---|
| 7,015,126 | B2* | 3/2006 | Wu | H01L 21/28097 257/E21.165 |
| 8,536,034 | B2* | 9/2013 | Flachowsky | H01L 21/26513 438/530 |
| 8,729,634 | B2* | 5/2014 | Shen | H01L 29/66818 257/368 |
| 2003/0216004 | A1* | 11/2003 | Jeong | H01L 21/31111 438/279 |
| 2005/0003638 | A1* | 1/2005 | Stolk | H01L 21/26513 438/482 |
| 2005/0272235 | A1* | 12/2005 | Wu | H01L 21/28097 438/592 |
| 2013/0052783 | A1* | 2/2013 | Flachowsky | H01L 21/26513 438/303 |

* cited by examiner

SEMICONDUCTOR DEVICES AND FABRICATION METHODS THEREOF

CROSS-REFERENCES TO RELATED APPLICATIONS

This application claims the priority of Chinese Patent Application No. CN201710312533.7 filed on May 5, 2017, the entire content of which is incorporated herein by reference.

FIELD OF THE DISCLOSURE

The present disclosure generally relates to the field of semiconductor fabrication technology and, more particularly, relates to semiconductor devices and fabrication methods.

BACKGROUND

With the rapid development of semiconductor technology, the feature size of semiconductor structures is continuously reduced, and the integration level of integrated circuits (ICs) becomes higher and higher. Accordingly, the requirements on the performance of the devices may be higher.

Currently, with the dimension of metal-oxide-semiconductor field-effect transistor (MOSFET) continuously becoming smaller, the channel length in MOSFET devices may have to be reduced in order to accommodate the reduction of the process node. The reduction of the channel length, may be conducive to increasing the density of transistors in the chip, improving the switching speed of the MOSFET devices.

However, as the channel length of devices decreases, the distance between the source and the drain of the devices may also be reduced. As a result, the ability of the gate structure in con trolling the channel may be degraded, and thus pinching off the channel by the gate may be more and more difficult. Therefore, the sub-threshold leakage phenomenon, e.g., the short-channel effect (SCE), becomes a crucial technical challenge and needs to be resolved.

In order to accommodate the requirements for scaling-down semiconductor devices, semiconductor process gradually switches from planar MOSFET devices to more efficient three-dimensional (3D) transistor devices, such as fin field-effect transistor (Fin-FET) devices, which demonstrate desired ability in controlling the channels.

However, the electrical performance of the conventional semiconductor structures may still need to be improved. The disclosed semiconductor devices and fabrication methods are directed to solve one or more problems set forth above and other problems in the art.

BRIEF SUMMARY OF THE DISCLOSURE

One aspect of the present disclosure provides a method for fabricating a semiconductor device. The method includes forming a plurality of gate structures on the base substrate. Each gate structure includes a gate electrode and sidewall spacers on each side surface of the gate electrode. The method also includes forming source/drain doped regions in the base substrate on opposite sides of each gate structure, forming a sacrificial layer on side surfaces of each sidewall spacer, and performing a pre-amorphous ion implantation process on the source/drain doped regions using the sacrificial layer as a mask.

Another aspect of the present disclosure provides a semiconductor device. The semiconductor structure includes a base substrate and a plurality of gate structures formed on the base substrate. Each gate structure includes agate electrode and sidewall spacers on each side surface of the gate electrode. The semiconductor structure also includes a sacrificial layer formed on the sidewall spacers on each side surface of the gate electrode, and source/drain doped regions formed in the base substrate on opposite sides of each gate structure. Each of the source/drain doped regions includes an amorphous layer from an ion implantation using the sacrificial layer as a mask.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A semiconductor device may be fabricated by providing a substrate, forming a plurality of gate electrodes on the substrate, forming sidewall spacers on the side surfaces of each gate electrode, and forming source/drain doped regions in the substrate on both sides of each gate electrode.

After forming the source/drain eloped regions, the fabrication method includes performing a pre-amorphous ion implantation process on the source/drain doped regions. The sidewall spacers formed on the side surfaces of the gate electrodes are used to define the positions of the source/drain doped regions. In addition, the sidewall spacers are also used to define the ion-implantation region for the pre-amorphous ion implantation process. Therefore, the ion-implantation region may be close to the channel region of the semiconductor structure. Moreover, after performing the pre-amorphous ion implantation process, an amorphous layer is formed in the source/drain doped regions. Because the distance between the position, of the amorphous layer and the channel region is small, the re-crystallization of the amorphous layer may cause a stress-releasing problem, leading to degradation of the quality of the amorphous layer. Accordingly, the quality of a metal silicide layer formed on the source/drain doped regions in a subsequent process may be degraded, which is not conducive to reducing the Schottky barrier strength in the semiconductor structure. Therefore, the contact resistance in the semiconductor structure may not be reduced, causing degradation of the electrical performance of the semiconductor structure.

The disclosed semiconductor structure may provide improved electrical performance.

Figure 11:
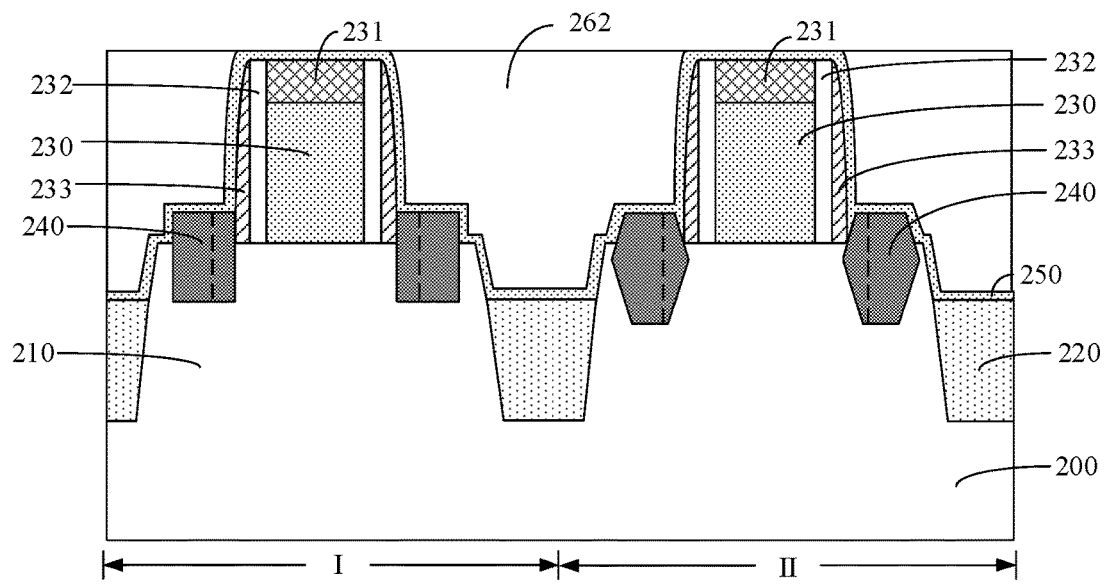
Figure 12:
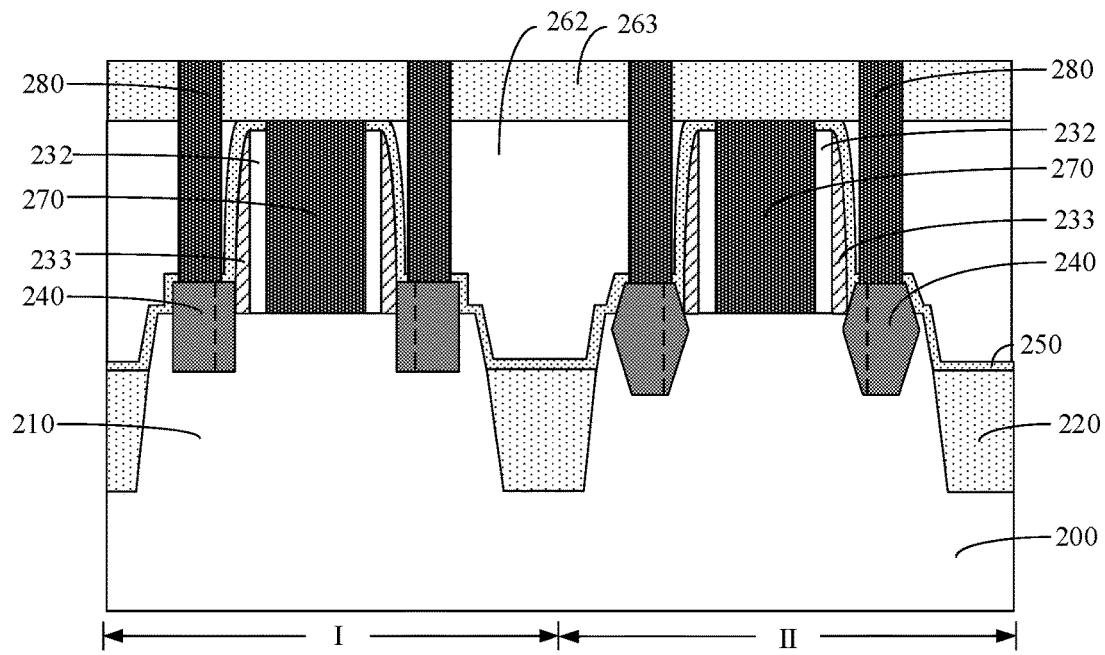
Figure 13:
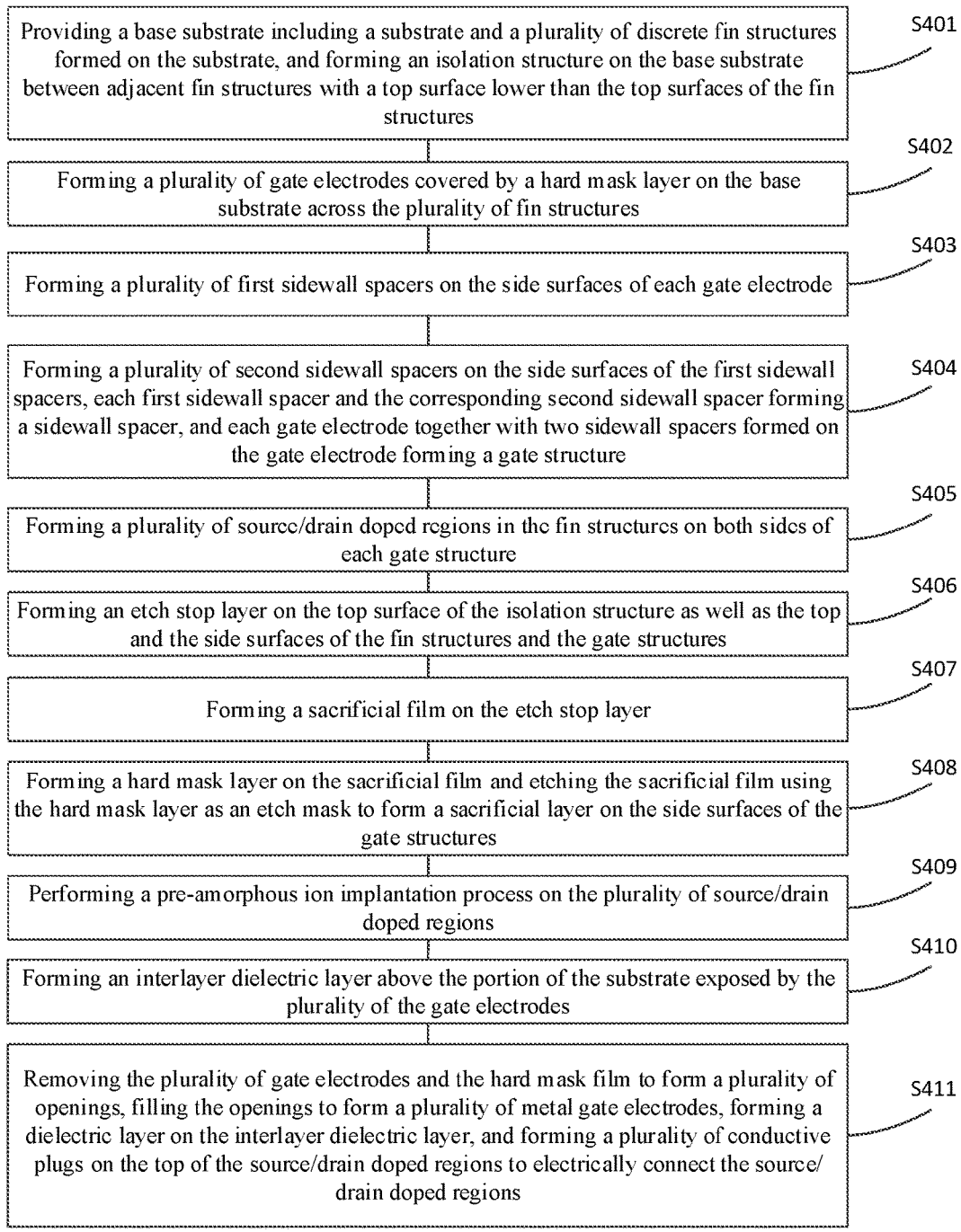
FIG. 13 illustrates a flowchart of an exemplary method for fabricating a semiconductor structure consistent with various embodiments of the present disclosure.

FIG. 13 illustrates a flowchart of the exemplary method for fabricating a semiconductor structure consistent with various embodiments of the present disclosure. FIGS. 1-12 illustrate schematic views of semiconductor structures at certain stages of the exemplary fabrication method.

Figure 1:
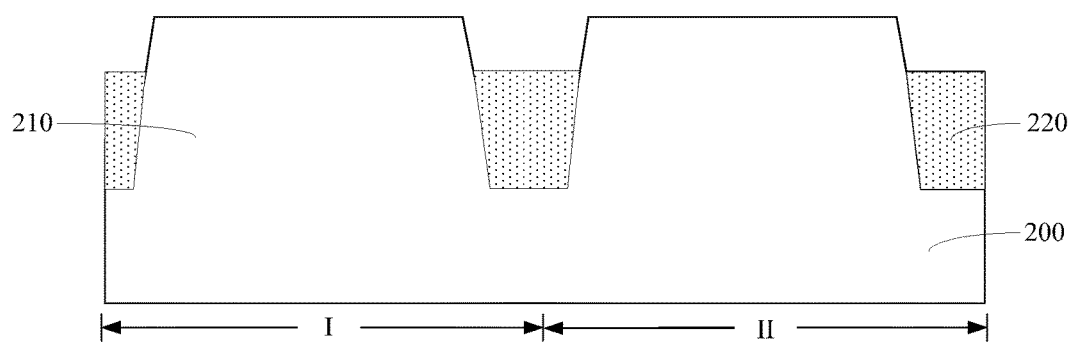
FIGS. 1-12 illustrate schematic views of semiconductor structures at certain stages of an exemplary fabrication method for a semiconductor structure consistent with various embodiment of the present disclosure.

Referring to FIG. 13, at the beginning of the fabrication process, a base substrate including a substrate and a plurality of discrete fin structures may be provided, and an isolation structure, with a top surface lower than the top surfaces of the fin structures, may be formed, on the portion of the substrate exposed by the fin structures (S401). FIG. 1 illustrates a schematic cross-section view of a semiconductor structure consistent with some embodiments of the present disclosure.

Referring to FIG. 1, a base substrate including a substrate 200 and a plurality of discrete fin structures 230 formed on the substrate 200 may be provided. An isolation structure 220 may be formed on the portion of the substrate 200 exposed by the plurality of fin structures 210. The isolation structure 220 may cover a portion of the side surfaces of each fin structure 210, and the top surface of the isolation structure 220 may be lower than the top surfaces of the fin structures 210.

In one embodiment, the semiconductor structure to be formed is a fin field-effect transistor (Fin-FET) device. In other embodiments, the semiconductor structure to be formed may be a planar semiconductor structure, and accordingly, the base substrate may be a planar substrate (not illustrated).

In one embodiment, the substrate 200 may include a first region I used to form N-type metal-oxide-semiconductor (NMOS) devices, and a second region II used to P-type metal-oxide-semiconductor (PMOS) devices, or vice versa. In other embodiments, the substrate may include only a first region or only a second region, and accordingly, the semiconductor devices to be formed may be NMOS devices or PMOS devices.

In one embodiment, the substrate 200 is made of silicon. In other embodiment, the substrate may be made of germanium, SiGe, SiC, GaAs, InAs, or any other appropriate semiconductor material. Alternatively, the substrate may be made of silicon on insulator (SOI) or germanium on insulator (GOI).

In one embodiment, the plurality of fin structures 210 are made of silicon. In other embodiment, the plurality of fin structures may be made of germanium, SiGe, SiC, GaAs, InAs, or any other appropriate semiconductor material.

In one embodiment, the isolation structure 220 may be used to electrically isolate neighboring fin structures 210 from each other. The isolation structure 220 may be made of $SiO_2$. In other embodiment, the isolation structure may be made of $SiN_x$ or SiON.

Figure 2:
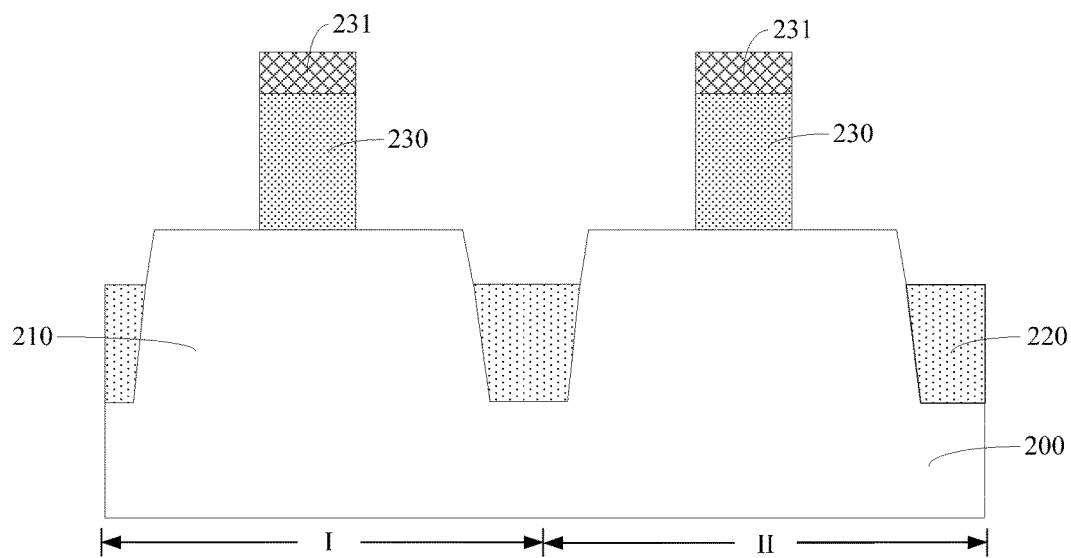

Further, referring to FIG. 13, a plurality of gate electrodes covered by a hard mask layer may be formed on the base substrate across the plurality of fin structures (S402). FIG. 2 illustrates a schematic cross-section view of a semiconductor structure consistent with some embodiments of the present disclosure.

Referring to FIG. 2, a plurality of gate electrodes 230 may be formed on the base substrate across the plurality of fin structures 210. The plurality of gate electrodes 230 may cover a portion of sidewall and top surfaces of each fin structure. A hard mask layer 231 may be formed on the gate electrodes 230.

In one embodiment, the gate electrodes 230 may be made of polycrystalline silicon. In other embodiments, the gate electrodes may be made of a metal material such that the gate electrodes may be metal gate electrodes.

In one embodiment, the plurality of gate electrodes 230 may be made by a process including the following exemplary steps. A gate electrode film may be formed on the plurality of fin structures 210 and the isolation structure 220. A hard mask film may be formed on the gate electrode film. Then, the hard mask film may be patterned to form the hard mask layer 231. Further, the plurality of gate electrodes. 230 may be formed by etching the gate electrode film using the hard mask layer 231 as an etch mask.

In one embodiment, the hard mask layer 231 may also be used to provide protection for the top surfaces of the plurality of gate electrodes 230 during the subsequent fabrication process. The hard mask layer 231 may be made of for example, $SiN_x$.

Figure 3:
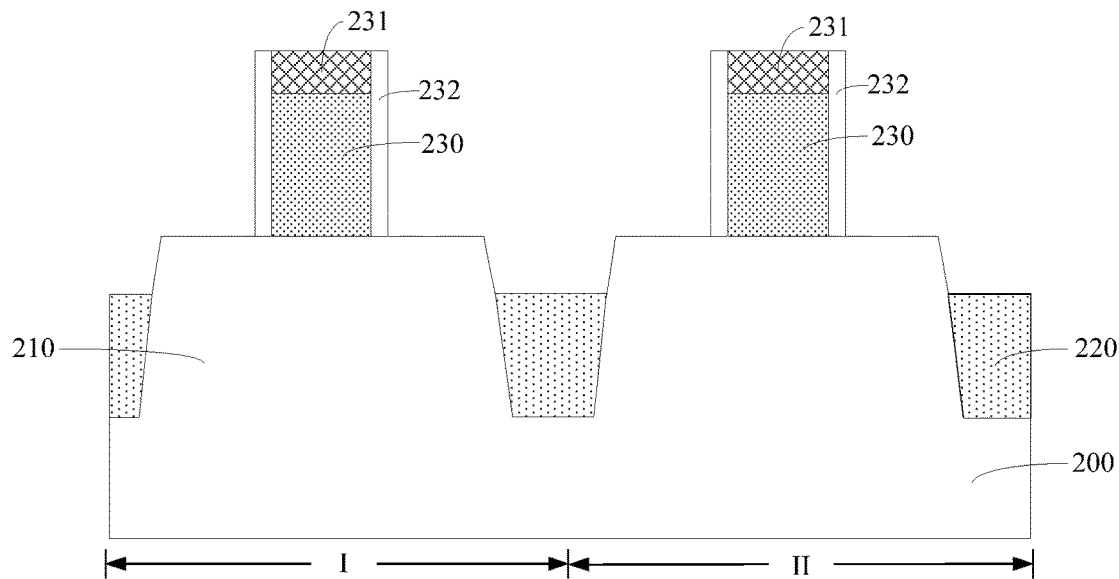

Further, returning to FIG. 13, a plurality of first sidewall spacers may be formed on the side surfaces of each gate electrode, and a plurality of lightly-doped regions may be formed in the fin structures on the both sides of each gate electrode (S403). FIG. 3 illustrates a schematic cross-section view of a semiconductor structure consistent with some embodiments of lire present disclosure.

Referring to FIG. 3, a plurality of first (offset) sidewall spacers 232 may be formed on the side surfaces of each gate structure 230. After forming the plurality of first sidewall spacers 232, a plurality of lightly-doped regions (not shown) may be formed in the fin structures 210 on both sides of each gate electrode 230.

In one embodiment, the plurality of first sidewall spacers 232 may be used to define the positions of the lightly-doped regions. The plurality of first sidewall spacers 232 may be made of $SiN_x$.

In one embodiment, the lightly-doped regions may be used to provide a gradient in the atomic concentration of impurities for subsequently-formed source/drain doped regions. As such, the electric field between the drain and the channel region may be reduced, which may be conducive to preventing the generation of hot carriers.

Figure 4:
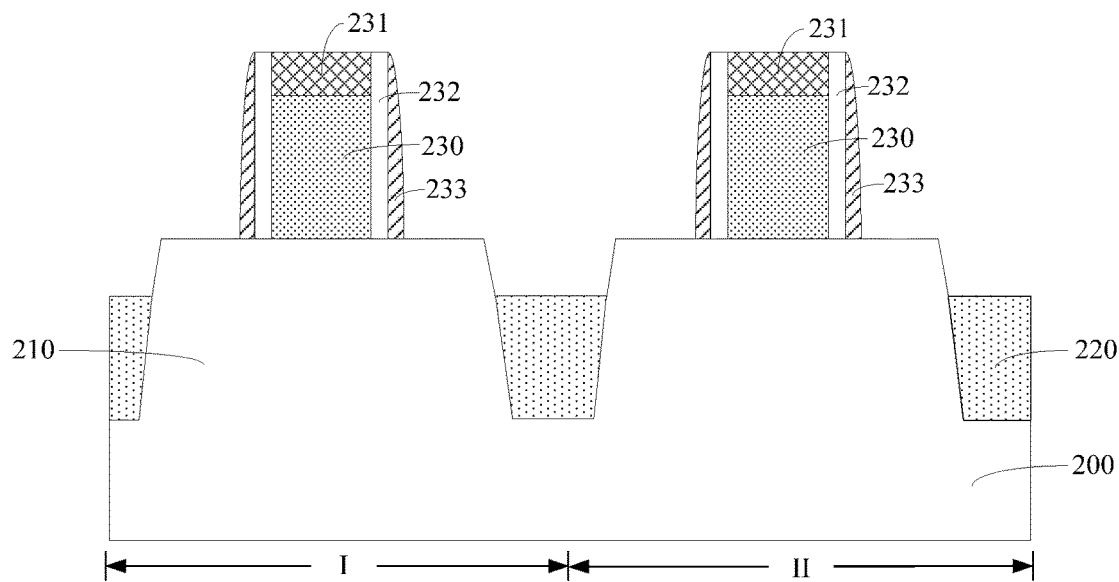

Further, returning to FIG. 13, a plurality of second sidewall spacers may be formed on the side surfaces of the first sidewall spacers (S404). FIG. 4 illustrates a schematic cross-section view of a semiconductor structure consistent with some embodiments of the present disclosure.

Referring to FIG. 4, a plurality of second (primary) sidewall spacers 233 may be formed on the side surfaces of the first sidewall spacers 232. In one embodiment, the first sidewall spacer 232 may be an offset sidewall spacer, and the second sidewall spacer 233 may be a primary sidewall spacer.

In one embodiment, the plurality of second sidewall spacers 233 may be used to define the positions of the subsequently-formed source/drain doped regions. The plurality of second sidewall spacers 233 may be made of $SiN_x$.

A second sidewall spacer 233 and the corresponding first sidewall spacer 232 may together form a sidewall spacer. Moreover, a gate electrode 230 together with the corresponding two sidewall spacers formed on the two sides of the gate electrode, respectively, may form a gate structure. Therefore, a plurality of gate structures may be formed on the substrate 200.

Figure 5:
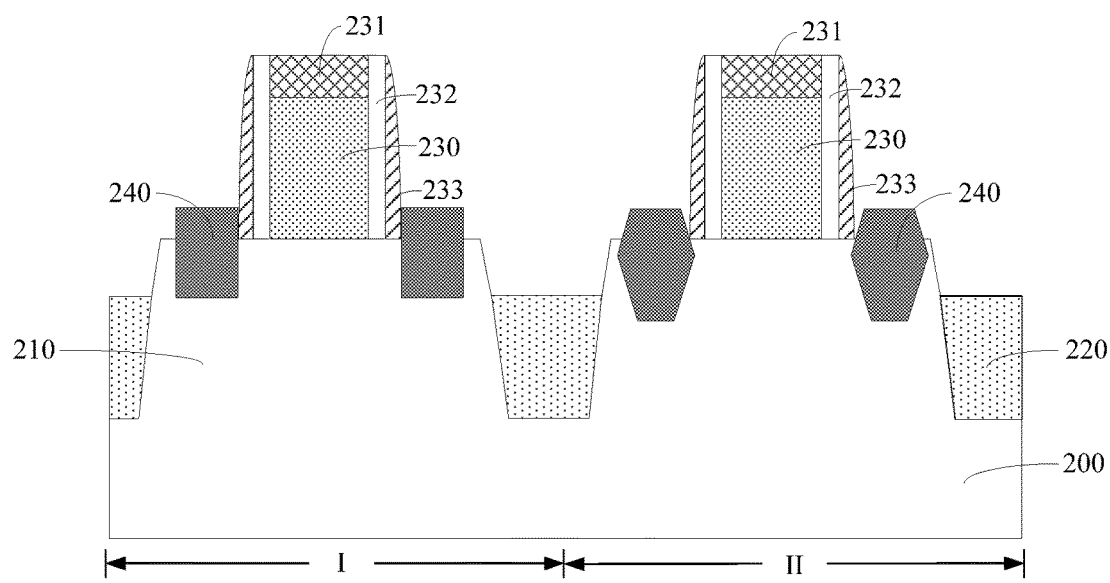

Further, returning to FIG. 13, a plurality of source/drain doped regions may be formed in the fin structures on both sides of each gate structure (S405). FIG. 5 illustrates a schematic cross-section view of a semiconductor structure consistent with some embodiments, of the present disclosure.

Referring to FIG. 5, a plurality of source/drain doped regions 240 may be formed in the fin structures 210 on both sides of each gate structure.

In one embodiment, the source/drain doped regions 240 formed in the first region I may be made of Si or SiC. In addition, the source/drain, doped regions 240 formed in the first region I may also contain N-type ions. The N-type ions may be P ions, As ions, or Sb ions. Moreover, the source/drain doped regions formed in the second region II may be made of Si or SiGe. In addition, the source/drain doped regions 240 formed in the second region II may also contain P-type ions. The P-type ions may be B ions, Ga ions, or In ions.

Figure 6:
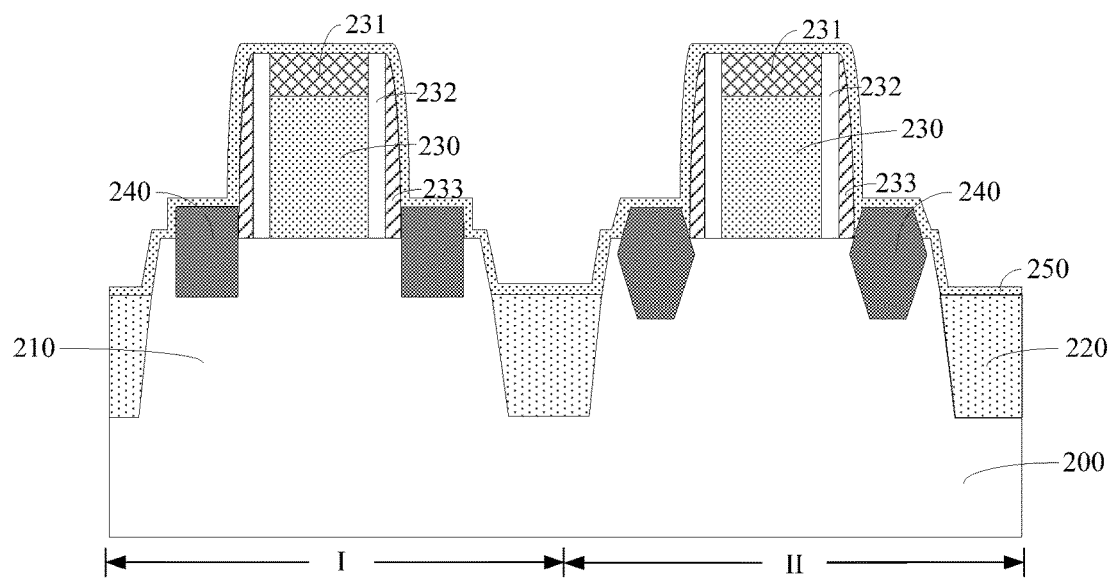

Further, returning to FIG. 13, an etch stop layer may be formed on be top surface of the isolation structure as well as the top and the side surfaces of the fin structures and the gate structures (S406). FIG. 6 illustrates a schematic cross-section view of a semiconductor structure consistent with some embodiments of the present disclosure.

Referring to FIG. 6, an etch stop layer 250 may be formed on the top surface of the isolation structure 220 and also on the top and the side surfaces of the fin structures 210 and the gate structures.

In one embodiment, the etch stop layer 250 may be used to define a stop position for a subsequently-performed etching process for form conductive plugs. The etch stop layer 250 may be made of one or more of $SiN_x$, SiBCN, SiCN, SiOCH, etc.

In one embodiment, the thickness of the etch stop layer 250 may not be too large or too small. When the thickness of the etch stop layer 250 is overly large, a subsequently formed interlayer dielectric layer may not demonstrate desired ability for filling holes. When the thickness of the etch stop layer 250 is too small, a subsequently-performed etching process for removing a sacrificial layer formed on the side surfaces of the sidewall spacers may have undesired effects on the semiconductor structure. Therefore, in one embodiment, the thickness of the etch stop layer 250 may be in a range of approximately 40 Å to 100 Å.

Figure 7:
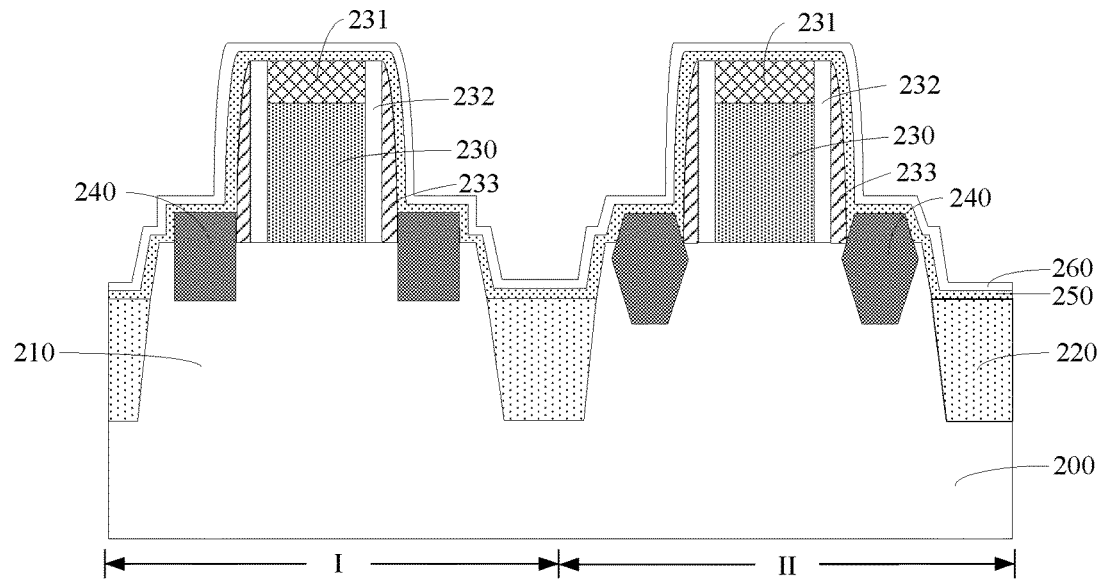

Further, returning to FIG. 13, a sacrificial film may be formed on the etch stop layer (S407). FIG. 7 illustrates a schematic cross-section views of a semiconductor structure consistent with some embodiments of the present disclosure.

Referring to FIG. 7, a sacrificial film 260 may be formed on the etch stop layer 250. In one embodiment, the sacrificial film 260 may be made of a material different from the material used to form the etch stop layer 250. The material used to form the sacrificial film 260 and the material used to form the etch stop layer 250 may have a relatively large etching selectivity ratio. Moreover, the sacrificial film 260 may be made of a material that can be easily removed. For example, the sacrificial film 260 may be made of one or more of $SiO_2$, SiC, and SiON.

In one embodiment, the sacrificial film 260 may be formed through an atomic layer deposition (ALD) process. The process parameters used in the ALD process may include a precursor including Si and $O_2$, a process temperature in a range of approximately 80° C. to 300° C., a process pressure in a range of approximately 5 mTorr to 20 mTorr, a number of ALD repetitions is in a range of approximately 5 to 50. In other embodiments, the sacrificial film may be formed through a chemical vapor deposition (CVD) process or any other appropriate film deposition process.

Figure 8:
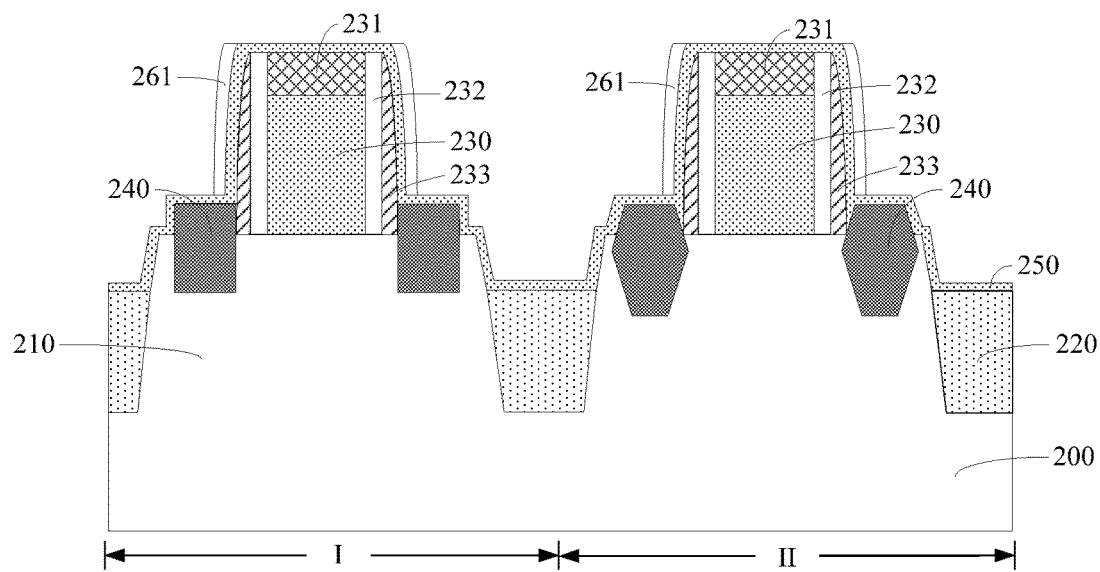

Further, returning to FIG. 13, a hard mask layer may be formed on the sacrificial film to expose a portion of the sacrificial film formed on the top surface of the isolation structure, the top and side surfaces of the fin structures, and the top surfaces of the gate structures, and then a sacrificial layer may be formed from the sacrificial film by removing the portion of the sacrificial film exposed by the hard mask layer (S408). FIG. 8 illustrates a schematic cross-section views of a semiconductor structure consistent with some embodiments of the present disclosure.

Referring to FIG. 8, a portion of the sacrificial film 260 (referring to FIG. 7) exposed by a hard mask layer (not shown) formed on the sacrificial film 260 may be removed through an etching process using the hard mask layer as an etch mask. The hard mask layer may expose the portion of the sacrificial film 260 formed on the top surface of the isolation structure 220, the top surfaces of the gate structures, and the top and the side surfaces of the fin structures 210. The remaining portion of the sacrificial film 260 formed on the side surfaces of the sidewall spacers may become a sacrificial layer 261.

In one embodiment, the material used, to form the sacrificial layer 261 may be different from the material used to form the etch stop layer 250. In a subsequent process, after performing a pre-amorphous ion implantation process on the source/drain doped, regions 240, the sacrificial layer 261 may be removed. Therefore, the material used to form the sacrificial layer 261 and the material used to form the etch stop layer 250 may have a relatively large etching selectivity ratio. Moreover, the sacrificial layer 261 may be made of a material that can be easily removed. For example, the sacrificial layer 261 may be made of one or more of $SiO_2$, SiC, and SiON.

In one embodiment, controlling the thickness of the sacrificial layer 261 may be able to ensure that ions, are implanted, into an appropriate range during the pre-amorphous ion implantation process. When the thickness of the sacrificial layer 261 is too large, the implanted range in the source/drain doped, region 240' during, the pre-amorphous ion implantation process may be too small. Therefore, an overly large thickness of the sacrificial layer 261 may not be conducive to reducing the contact resistance in the semiconductor structure. When the thickness of the sacrificial layer 261 is too small, the implanted range in the source/drain doped region 240 may be close to the corresponding channel region. As such, the re-crystallization of the amorphous layer may cause a stress-releasing problem, leading to undesired electrical performance of the semiconductor structure. Therefore, the thickness of the sacrificial layer 261 may be in a range of approximately 30 Å to 150 Å.

According to the disclosed fabrication process, a sacrificial layer 261 may be formed and then a pre-amorphous ion implantation process may be performed on the source/drain doped regions 240. Because the sacrificial layer 261 is formed on the side surfaces of the sidewall spacers, the sacrificial layer 261 may be able to define the ion-implantation, region for the pre-amorphous ion implantation process. Therefore, the presence of the sacrificial layer 261 may be able to ensure that the ion-implantation region is far away from the channel region of the semiconductor structure. During the pre-amorphous ion implantation process, an amorphous layer may be formed in the source/drain doped regions 240. Accordingly, the position of the amorphous layer may be far away from the channel region, and thus the stress-releasing problem caused by the re-crystallization of the amorphous layer may be resolved. As such, the quality of the amorphous layer may be improved. In a subsequent process, a metal silicide layer may be formed on the source/drain doped regions 240. Because the quality of the amorphous layer is desired, the quality of the metal silicide layer may also be improved. Therefore, the Schottky barrier strength in the semiconductor structure may be reduced, and the contact resistance in the semiconductor structure may also be reduced. As such, the electrical performance of the semiconductor structure may be improved.

Figure 9:
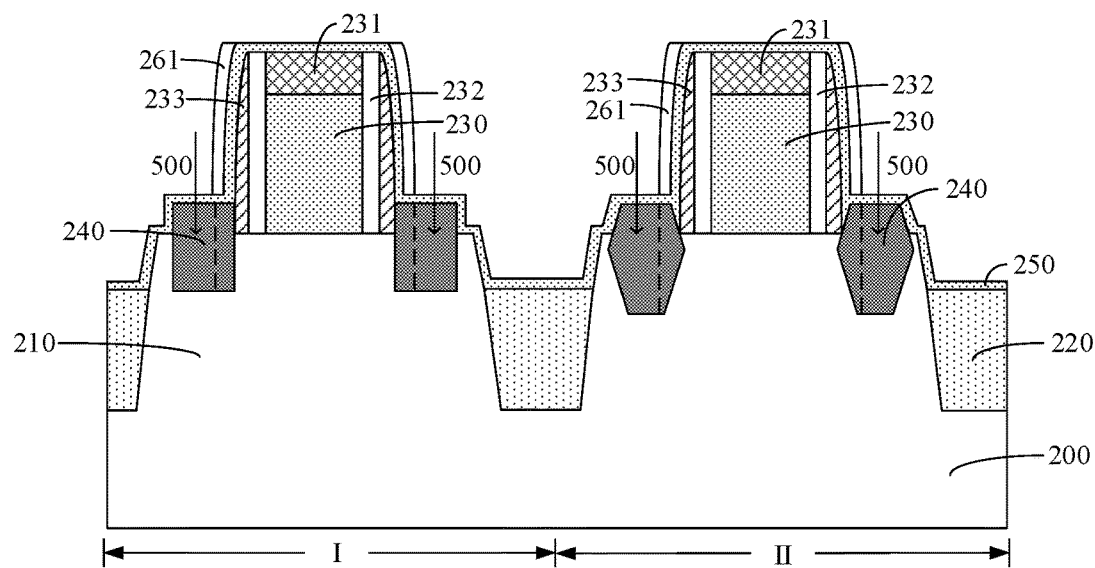

Returning to FIG. 13, a pre-amorphous ion implantation process may be performed on the plurality of source/drain doped regions (S409). FIG. 9 illustrates a schematic cross-section views of a semiconductor structure consistent with some embodiments of the present disclosure.

Referring to FIG. 9, a pre-amorphous ion-implantation, process 500 may be performed on the plurality of source/drain doped regions 240.

In one embodiment, performing the pre-amorphous ion implantation process 500 on the source/drain doped regions 240 may form an amorphous layer in the source/drain doped regions 240 so that the quality of a subsequently-formed metal silicide layer in the source/drain doped regions 240 may be improved. As such, the Schottky barrier strength in the semiconductor structure may be reduced, and the contact resistance in the semiconductor structure may also be reduced. Thus, the electrical performance of the semiconductor structure may be improved. Because of the presence of the sacrificial layer 261, the ion-implantation region during the pre-amorphous ion implantation process 500 may be far away from the channel region. That is, the portion of each source/drain doped region 240 that receives the implanted ions may have a certain distance from the channel region. For example, as shown in FIG. 9, during the pre-amorphous ion implantation process 500, ions may be implanted into each source/drain doped region 240 along a direction perpendicular to the substrate 200, and in each source/drain doped region 240, a dashed line aligned with the sidewall surface of the sacrificial layer 261 formed on the corresponding sidewall spacer may divide the source/dram doped region 240 into two portions. Among the two portions of each source/drain doped region 240 separated by the dashed line, the portion further away from the corresponding gate electrode 230 may be able to receive the implanted ions, and thus become the ion-implantation region; in the meantime, the portion closer to the corresponding gate electrode 230 may not be able to receive implanted ions. Therefore, the stress-releasing problem caused by the re-crystallization of the amorphous layer may be solved, which is conducive to reducing the contact resistance in the semiconductor structure.

In one embodiment, the doping ions implanted into the source/drain doped regions 240 during the pre-amorphous ion implantation process 500 may include one or more of C ions, Ge ions, and Si ions. Moreover, the parameters used in the pre-amorphous ion implantation process 500 may include an implantation energy in a range of approximately 5 keV to 20 keV, and an implantation dose in a range of approximately 4.0E13 atom/cm$^2$ to 2.3E15 atom/cm$^2$.

Figure 10:
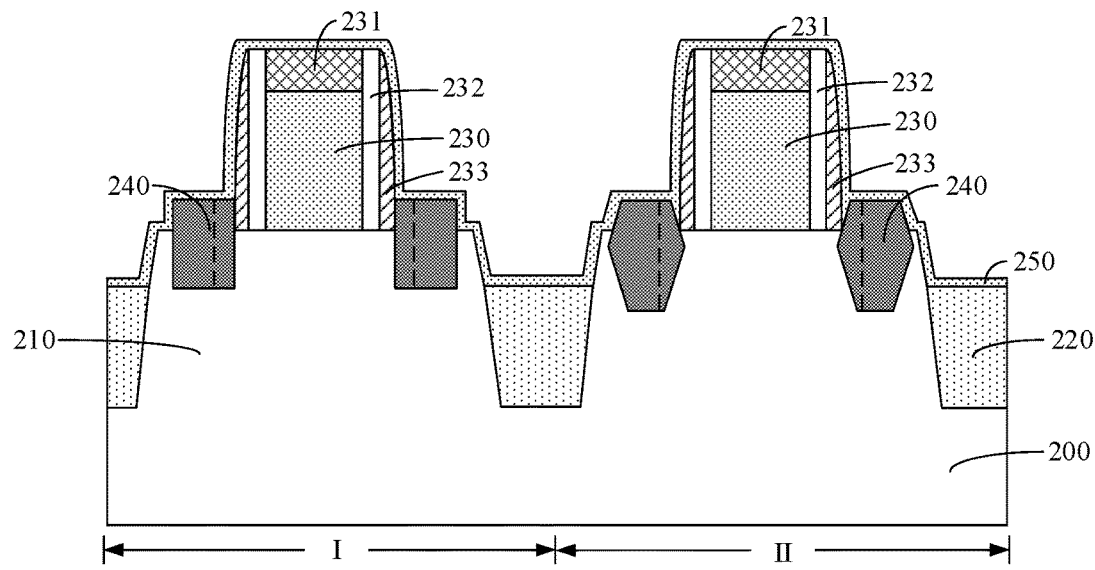

Further, returning to FIG. 13, the sacrificial layer may be removed after performing the pre-amorphous ion implantation process (S410). FIG. 10 illustrates a schematic cross-section views of a semiconductor structure consistent with some embodiments of the present disclosure.

Referring to FIG. 10, after performing the pre-amorphous ion implantation process 500 (referring to FIG. 9), the sacrificial layer 261 may be removed.

In one embodiment, removing the sacrificial layer 261 may be able to improve the ability of a subsequently-formed interlayer dielectric layer for filling holes, and thus may improve the quality of the interlayer dielectric layer. In other embodiments, the sacrificial layer may be retained after performing the pre-amorphous ion implantation process 500. As such, the fabrication process for the semiconductor structure may be simplified.

Further, returning to FIG. 13, an interlayer dielectric layer may be formed above the portion of the substrate exposed by the plurality of the gate electrodes (S410). FIG. 11 illustrates a schematic cross-section views of a semiconductor structure consistent with some embodiments of the present disclosure.

Referring to FIG. 11, an interlayer dielectric layer 262 may be formed above the portion of the substrate 200 exposed, by the plurality of gate electrodes 230.

In one embodiment, the interlayer dielectric layer 262 may be used to isolate neighboring metal layers. The interlayer dielectric layer 262 may be made of one or more of $SiO_2$, $SiN_x$, SiON, SiOC, etc.

Further, returning to FIG. 13, the plurality of gate electrodes and the hard mask film may be removed to form a plurality of openings, a plurality of metal gate electrodes may be formed to fill up each opening, a dielectric layer may be formed on the interlayer dielectric layer, and a plurality of conductive plugs electrically connected to the plurality of source/drain doped regions may be formed on the top of the source/drain doped regions (S411). FIG. 12 illustrates a schematic cross-section views of a semiconductor structure consistent with some embodiments of the present disclosure.

Referring to FIG. 12, the plurality of gate electrodes 230 (referring to FIG. 11) and the hard mask layer 231 (referring to FIG. 11) may be removed to form a plurality of openings (not shown). The plurality of openings may be filled up with a metal material to form a plurality of metal gate electrodes 270. A dielectric layer 263 may be formed on the interlayer dielectric layer 262. Moreover, a plurality of conductive plugs 280 may be formed on the top of the source/dram doped regions 240 to electrically connect the source/drain doped regions 240.

In one embodiment, prior to forming the plurality of conductive plugs 280, the fabrication process may optionally include forming a metal silicide layer on the top of the source/drain doped regions 240. The metal silicide layer may be used to reduce the contact resistance of the semiconductor structure. Because the implanted range in each source/drain doped region 240 during the pre-amorphous ion implantation process 500 (referring to FIG. 9) may be far away from the channel region, the formed amorphous layer may unlikely have the stress-releasing problem. That is, the amorphous layer may be far away from the channel region, and the stress may be retained. Therefore, the quality of the amorphous layer may be improved. Accordingly, the quality of the subsequently-formed metal silicide layer may also be improved. As such, the contact resistance in the semiconductor structure may be reduced.

In one embodiment, the plurality of metal gate electrodes 270 may be made of one or more of Ti, Ta, TiN, TaN, AlTi, AlNTi, Co, Al, Wu, Ag, and any other appropriate metal material. Moreover, the dielectric layer 263 may be made of a low-fc dielectric material. The low-k dielectric material, may refer to a dielectric material with a dielectric constant lower than 3.9, for example.

Further, the present disclosure provides a semi conductor structure, FIG. 8 illustrates a schematic cross-section view of a semiconductor structure consistent with some embodiments of the present disclosure.

Referring to FIGS. 8-12, the semiconductor structure may include a base substrate. The base substrate may include a substrate 200 and a plurality of discrete fin structures 210 formed on the substrate 200. The semiconductor structure may also include an isolation structure 220 and a plurality of gate structures formed on the fin structures 210. The isolation structure 220 may be formed on the portion of the substrate 200 exposed by the plurality of fin structures 210. In one embodiment, the semiconductor structure may include a hard mask layer 231 formed on the top surfaces of gate structures. In addition, each gate structure may include a gate electrode 230 and two sidewall spacers (not labeled) formed on the two opposite sides of the gate electrode 230. Each sidewall spacer may further include a first sidewall spacer 232 and a second sidewall spacer 233. Further, the semiconductor structure may also include a sacrificial layer 261 formed on the side surfaces of the sidewall spacers, and a plurality of source/drain doped regions 240 formed in the fin structures 210 on both sides of each gate structure.

In one embodiment, the presence of the sacrificial layer 261 may be able to ensure that the ion-implantation region during the pre-amorphous ion implantation process 500 (referring to FIG. 9) performed on the source/drain doped region 240 is far away from the channel region of the semiconductor structure, for example, by a thickness of the sacrificial layer 261. As such, the contact resistance in the semiconductor structure may be reduced, and the electrical performance of the semiconductor structure may be improved.

Compared to conventional semiconductor structures and fabrication methods, the disclosed semiconductor structures and fabrication methods may demonstrate advantages.

According to the disclosed semiconductor structures and fabrication methods, the sacrificial layer is formed on the side surfaces of the sidewall spacers. When performing the pre-amorphous ion implantation process on the source/drain doped regions, the sacrificial layer is able to ensure that the ion-implantation region is far away from the channel region of the semiconductor structure, for example, by a thickness of the sacrificial layer on the sidewall spacer. As such, the amorphous layer formed after performing the pre-amorphous ion implantation process is also far away from the channel region. Because the amorphous layer is far away from the channel region, the stress-releasing problem caused by the re-crystallization of the amorphous layer may be solved. Therefore, the quality of the amorphous layer may be improved. In addition, the improved quality of the amorphous layer may ensure that the quality of the metal silicide layer formed on the source/drain doped regions is also improved. Therefore, the Schottky barrier strength in the semiconductor structure may be reduced, and the contact resistance in the semiconductor structure may also be reduced. As such, the electrical performance of the semiconductor structure may be improved.

Moreover, the thickness of the sacrificial layer is in a range of approximately 30 Å to 150 Å, from the surface of the corresponding sidewall spacer. When the thickness of the sacrificial layer is too large, the implanted range in the source/drain doped region during the pre-amorphous ion implantation process may be too small. Therefore, an overly large thickness of the sacrificial layer may not be conducive to reducing the contact resistance in the semiconductor structure. When the thickness of the sacrificial layer is too small, the implanted range in the source/drain doped region may be close to the corresponding channel region. As such, the re-crystallization of the amorphous layer may cause a stress-releasing problem, leading to undesired electrical performance of the semiconductor structure.

The above detailed descriptions only Illustrate certain exemplary embodiments of the present invention, and are not intended to limit the scope of the present, invention. Those skilled in the art can understand the specification, as whole and technical features in the various embodiments can be combined into other embodiments understandable to those persons of ordinary skill in the art. Any equivalent or modification thereof without departing from the spirit and principle of the present invention, falls within the true scope of the present invention.

What is claimed is:

1. A method for fabricating a semiconductor structure, comprising:
    forming a plurality of gate structures on the base substrate, wherein each gate structure includes a gate electrode and sidewall spacers on each side surface of the gate electrode;
    forming source/drain doped regions in the base substrate on opposite sides of each gate structure;
    forming a sacrificial layer on side surfaces of each sidewall spacer; and
    performing a pre-amorphous ion implantation process on the source/drain doped regions using the sacrificial layer as a mask, wherein each of the source/drain doped regions is divided, in a direction perpendicular to a top surface of the substrate and an extension direction of the gate structures, into a first portion directly covered by the sacrificial layer and an amorphous layer exposed by the sacrificial layer.

2. The method for fabricating the semiconductor structure according to claim 1, wherein:
    the sacrificial layer is made of at least one of $SiO_2$, SiC, and SiON.

3. The method for fabricating the semiconductor structure according to claim 1, wherein:
    the gate electrode includes a metal gate electrode.

4. The method for fabricating the semiconductor structure according to claim 1, wherein:
    the gate electrode is a polycrystalline silicon gate electrode.

5. The method for fabricating the semiconductor structure according to claim 1, after performing the pre-amorphous ion implantation process on the source/drain doped regions, further including:
    forming a conductive plug on each of the source/drain doped regions to electrically connect to each of the source/drain doped regions.

6. The method for fabricating the semiconductor structure according to claim 1, wherein the base substrate includes a substrate and a plurality of fin structures, and:
    the plurality of gate structures are formed across the fin structures; and
    the source/drain doped regions are formed in a corresponding fin structure on the opposite sides of each gate structure.

7. The method for fabricating the semiconductor structure according to claim 1, wherein:
    each of the source/drain doped regions is divided by a plane parallel to each side surface of the gate electrode and tangent to sidewalls of the sacrificial layer to two regions adjacent to each other, and
    ions doped into the source/drain doped regions during the pre-amorphous ion implantation process include at least one of C ions, Ge ions, and Si ions.

8. The method for fabricating the semiconductor structure according to claim 7, wherein parameters used in the pre-amorphous ion implantation process include:
    an implantation energy in a range of approximately 5 keV to 20 keV;

an implantation dose in a range of approximately 4.0E13 atom/cm$^2$ to 2.3E15 atom/cm$^2$.

9. The method for fabricating the semiconductor structure according to claim 1, after forming the source/drain doped regions and prior to forming the sacrificial layer, further including:
forming an etch stop layer on the base substrate as well as top and side surfaces of the gate structures.

10. The method for fabricating the semiconductor structure according to claim 9, wherein:
the etch stop layer and the sacrificial layer are made of different materials.

11. The method for fabricating the semiconductor structure according to claim 1, wherein:
a thickness of the sacrificial layer is in a range of approximately 30 Å to 150 Å.

12. The method for fabricating the semiconductor structure according to claim 3, wherein forming the sacrificial layer includes:
forming a sacrificial film on the base substrate as well as top and side surfaces of the gate structures;
forming a hard mask layer on the sacrificial film to expose a portion of the sacrificial film formed on the base substrate and top surfaces of the gate structures; and
removing the portion of the sacrificial film formed on the base substrate and the top surfaces of the gate structures to form the sacrificial layer using the hard mask layer as an etch mask.

13. The method for fabricating the semiconductor structure according to claim 12, wherein:
the sacrificial film is formed by a chemical vapor deposition process.

14. The method for fabricating the semiconductor structure according to claim 12, wherein:
the portion of the sacrificial film formed on the base substrate and the top surfaces of the gate structures is removed by a dry etching process.

15. A semiconductor structure, comprising:
a base substrate;
a plurality of gate structures formed on the base substrate, wherein each gate structure includes a gate electrode and sidewall spacers on each side surface of the gate electrode;
a sacrificial layer formed on the sidewall spacers on each side surface of the gate electrode; and
source/drain doped regions formed in the base substrate on opposite sides of each gate structure, wherein
each of the source/drain doped regions includes an amorphous layer exposed by the sacrificial layer from an ion implantation using the sacrificial layer as a mask and a remaining portion of each of the source/drain doped regions directly covered by the sacrificial layer, and
the amorphous layer and the remaining portion of each of the source/drain doped regions are divided, in a direction perpendicular to a top surface of the substrate and an extension direction of the gate structures.

16. The semiconductor structure according to claim 15, wherein:
the sacrificial layer is made of at least one of SiO$_2$, SiC, and SiON.

17. The semiconductor structure according to claim 15, wherein:
a thickness of the sacrificial layer is in a range of approximately 30 Å to 150 Å.

18. The semiconductor structure according to claim 15, wherein:
the source/drain doped regions are doped by ions including at least one of C ions, Ge ions, and Si ions.

19. The semiconductor structure according to claim 15, further including:
a conductive plug formed on each of the source/drain doped regions to electrically connect to each of the source/drain doped regions.

20. The semiconductor structure according to claim 15, wherein the base substrate includes a substrate and a plurality of fin structures, and
the plurality of gate structures are formed across the fin structures; and
the source/drain doped regions are formed in a corresponding fin structure on the opposite sides of each gate structure.

* * * * *